United States Patent [19]

Moench

[11] 4,045,793
[45] Aug. 30, 1977

[54] DIGITAL TO ANALOG CONVERTER

[75] Inventor: Jerry Dale Moench, Tempe, Ariz.

[73] Assignee: Motorola, Inc., Schaumburg, Ill.

[21] Appl. No.: 617,923

[22] Filed: Sept. 29, 1975

[51] Int. Cl.$^2$ .............................................. H03K 13/04
[52] U.S. Cl. .............................................. 340/347 DA
[58] Field of Search ............... 340/347 DA; 307/205, 307/251, 303, 304, DIG. 5

[56] References Cited

U.S. PATENT DOCUMENTS

| | | | |
|---|---|---|---|
| 3,643,253 | 2/1972 | Blank | 340/347 DA |
| 3,646,587 | 2/1972 | Shaffstall | 340/347 DA |
| 3,747,088 | 7/1973 | Pastoriza | 340/347 DA |
| 3,836,906 | 9/1974 | Ando | 340/347 DA |

Primary Examiner—Charles D. Miller
Attorney, Agent, or Firm—Charles R. Hoffman

[57] ABSTRACT

An MOS digital to analog converter on a semiconductor chip includes N digital inputs and a single analog output. The digital inputs control circuitry which switches in various combinations of $2^0+2^1+...2^{N-1}$ IGFETs with substantially similar voltage current characteristics coupled between a voltage supply conductor and an analog current output conductor. The IGFETs are arranged in N groups, each group being controlled, respectively, by one of the digital inputs. The number of IGFETs in each group is given by the expression $2^{n-1}$ where $1 \leq n \leq N$. A control circuit including a plurality of substantially identical diode-connected IGFETs is coupled between a constant current source and the voltage supply conductor. The voltage supply conductor provides a voltage which is gated by means of switching circuitry controlled by the digital inputs to the gate electrodes, respectively, of each of the groups of IGFETs. This circuit controls the ratio between the analog output current and the current of the current source, and also assures that each of the IGFETs connected to the analog output conductor operates in the saturation portion of its current-voltage characteristic.

4 Claims, 1 Drawing Figure

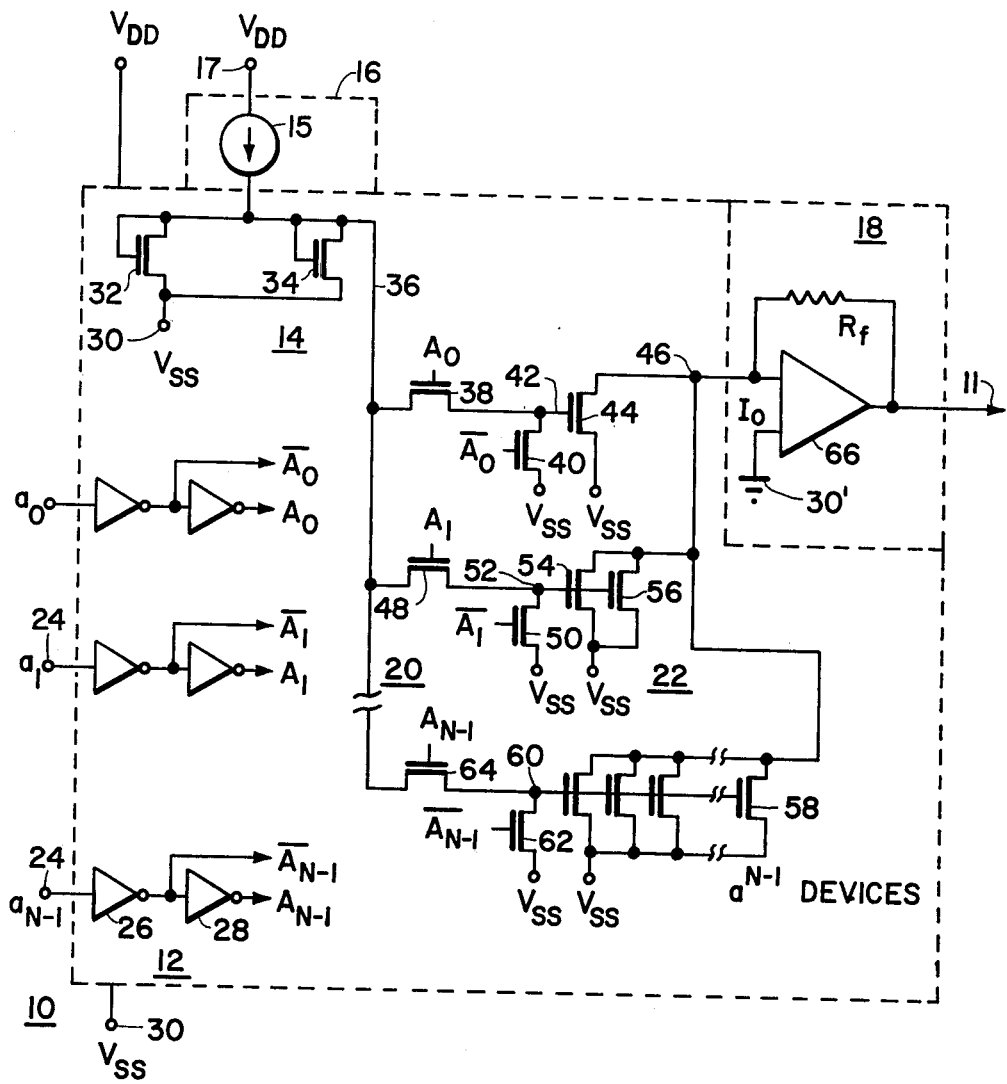

DIGITAL TO ANALOG CONVERTER

BACKGROUND OF THE INVENTION

1. Field of the invention:

The invention relates to IGFET circuits and to analog to digital converters, and more particularly to IGFET analog to digital converters which may be implemented on a semiconductor chip.

2. Description of the prior art:

MOS technology has been utilized recently to implement a wide variety of complex electronic functions on semiconductor chips. In particular, extremely complex memory and digital logic functions have been implemented on single semiconductor substrates utilizing MOS technology, and to a lesser extent linear circuits have also been implemented thereby. Although digital to analog converters have been available for some time, most applications for electronic digital to analog converter circuits require use of precision value discrete components. For example, many digital to analog converters utilize precision resistor ladder networks or networks of precision constant current sources. With present tolerances associated with the manufacture of MOSFET integrated circuit devices, there is a wide tolerance variation in individual MOSFET characteristics. This wide tolerance variation is in direct conflict with the precision device characteristics required by many prior approaches to digital to analog conversion. Although some digital to analog converters have been implemented on a semiconductor chip utilizing MOSFET technology, the designs have not been suitable for producing the degree of accuracy required in many applications.

SUMMARY OF THE INVENTION

It is an object of this invention to provide an MOS digital to analog converter having an analog output signal which is independent of variations in the logical 0 and logical 1 levels of the digital inputs thereof.

It is another object of the invention to provide an MOS digital to analog converter which is relatively independent of end effects associated with integrated circuit MOSFETs.

It is another object of the invention to provide circuitry for controlling the ratio between magnitudes of a set current applied to a digital to analog converter semiconductor chip and an analog output current signal for any particular configuration of binary inputs.

Briefly described, the invention is a digital to analog converter including a plurality of electron control devices each having substantially similar characteristics arranged in a plurality of groups. Each group of electron control devices includes at least one or more of the electron control devices coupled in parallel between the voltage supply conductor and a first output conductor for producing an analog output current on said first output conductor representative of a plurality of binary input signals. In one embodiment the electron control devices are MOSFETs and the digital to analog converter chip includes a first circuit coupled by switching circuitry to the gates of each of the MOSFETs and the N groups for controlling the portion of the characteristic of each of the MOSFETs so that each MOSFET, when in an on condition, operates in the saturation region of its voltage-current characteristic.

BRIEF DESCRIPTION OF THE DRAWING

The sole FIGURE is a partial schematic diagram of a presently preferred embodiment of the invention.

DESCRIPTION OF THE INVENTION

Referring to the Figure, digital to analog converter semiconductor chip 10 includes N digital inputs $a_0$, $a_1$, ***$a_{N-1}$. Each of the digital inputs is connected to a buffer circuit on chip 10 which includes two inverter circuits coupled in series. For example, digital input $a_{N-1}$ is connected to the input of inverter 26, the output of which generates a signal designated $\bar{A}_{N-1}$ and is connected to the input of second inverter 28, which has an output designated $A_{N-1}$. The combination of all the input buffer circuits form input circuitry 12.

Analog to digital converter chip 10 also includes circuit 14 which includes a plurality of insulated gate field effect transistors (IGFETs) having their sources connected to $V_{SS}$ conductor 30 and node 36.

Those skilled in the art will recognize that MOSFETs (metal oxide semiconductor field effect transistors), as implemented in typical integrated circuits, are bilateral devices, having a gate and a source and a drain. However, the source and drain are functionally interchangeable, so both in the description and in the claims herein, the terms are utilized merely to indicate specific interconnections, rather than function, of a particular MOSFET terminal. For example, a terminal of MOSFET 34 which functions as a drain for one part of the circuit operation may function as a source for another part of the circuit operation. For a more complete description of the operation and physics of MOSFETs, see "Physics and Technology of Semiconductor Devices", by A. S. Grove, John Wiley & Sons, Inc., 1967. Those skilled in the art will also recognize that the acronym MOSFET is commonly used synonymously with the term IGFET (insulated gate field effect transistor), even though the gate may be polycrystalline silicon or some other conductive material rather than metal.

External current source 15 is connected between node 36 and $V_{DD}$ conductor 17. Current source 15 is provided externally to analog to digital converter chip 10. Semiconductor chip 10 also includes control circuitry which includes N circuits each including two IGFETs. For example, IGFET 38 has its gate connected to $A_0$, its drain connected to node 36 and its source connected to node 42. IGFET 40 has its drain connected to node 42, it source connected to $V_{SS}$ conductor 30 and its gate connected $\bar{A}_0$. $A_0$ and $\bar{A}_0$ are the outputs of the buffer circuit which has $A_0$ as an input. Similarly, a second switching circuit includes MOSFET 48 having its drain connected to node 36, its source connected to node 52, and its gate connected to $A_1$, while IGFET 50 has its drain connected to node 52, its source connected to $V_{SS}$, and its gate connected to $\bar{A}_1$. There are a total of N switching circuits similar to the two described above, each being coupled, respectively, to a corresponding digital input buffer circuit.

Section 22 of analog to digital converter semiconductor chip 10 includes N groups of IGFETs connected between output conductor 46 and $V_{SS}$ conductor 30. For example, a first group only includes IGFET 44, which has its gate connected to node 42, it source connected to $V_{SS}$, and its drain connected to node 46. A second group of IGFETs includes IGFETs 54 and 56 each having its source connected to $V_{SS}$ and its drain connected to node 46 and its gate connected to node 52.

Similarly, a plurality of other groups of IGFETs are provided, the last group including $2^{N-1}$ IGFETs 58 each having their source connected to $V_{SS}$ and their drain connected to conductor 46 and their gate connected to node 60. The number of IGFETs in the successive groups is given by the expression $2^{n-1}$ where $n$ is an integer having the relation $1 \leq n \leq N$.

Current-to-voltage converter circuit 18 includes an operational amplifier 66 having one input connected to ground conductor 30' and another input connected to node 46. Operational amplifier 66 has a voltage output node 11 and has a feedback resistor $R_f$ connected between node 11 and node 46.

The embodiment of the invention of the sole FIGURE operates on the principle of switching in a number of IGFETS biased to operate as current sources equal to the digital number represented by the configuration of logic levels applied to the binary inputs. Each of the IGFETs, when turned on by circuitry controlled by the digital inputs, is designed to have the same current flowing therethrough. Therefore, if the voltage on the output is held relatively constant, the output current $I_o$ is an analog function of a digital input.

The output current can be represented by the following equation:

$$I_o = \frac{I_{o(max)}}{2^n - 1} (a_0 + 2a_1 + 4a_2 + \ldots 2^{n-2}a_{n-2} + 2^{n-1}a_{n-1})$$

$$I_{o(max)} \approx I_{set} \cdot \frac{(2^n - 1)}{2^k} ; \text{ if } V_o \geq V_{Ref} > V_{SS} + V_{TO}$$

The above equation is valid if the drain to source current $I_{DS}$ is the same for all of the IGFETs in the above mentioned groups is the same. This will be true if the IGFETs are of the same size, shape, and orientations on the semiconductor chip. Variations in geometry and device parameters across the surface of the semiconductor chip are the limiting factor with respect to how many bits the digital to analog converter circuit may have for a given degree of required accuracy. However, it should be relatively feasible to provide an acceptable degree of accuracy for five to 10 bit analog to digital converter circuits implemented on a single chip.

Typical values for the parameters in the above equation could be $k = 10$; $N = 10$; $V_{SS} = -5$ volts; $V_{DD} = +10$ volts; $I_{SET}$ approximately 1 milliamp; $-1 < V_{Ref} < -3$ volts; $I_{o(max)} = 1$ milliamp.

According to the invention, provision of separate MOS devices having equal channel lengths and channel widths such as IGFETs 54 and 56, assures that the current contribution to the total analog output current $I_o$ will be precisely proportional to the number of such IGFETs switched in. If, instead the MOSFETs in each group were replaced by an equivalent MOSFET having the same channel lengths and a channel width equal to the sum of the channel widths of the separate devices, slightly less chip area might be consumed, but inaccuracies would result from irregularities caused by end effects of the IGFETs. Generally, the end effects will cause the total current of a plurality of IGFETs having a total channel width to be greater than the current through a single IGFET having a channel width equal to the sum of the individual channel widths because of the fringing effect at the ends of the channel region.

It should be noted that the digital to analog converter of the invention could be readily implemented utilizing CMOS (complementary MOS) technology. In this case, the inverters such as 26 and 28 of the input buffer circuits could be eliminated, and the external inputs $a_0$, etc. could be coupled directly to the switching circuits. Each switching circuit would then include a P channel MOSFET and an N channel MOSFET, each having their gate electrode connected to the digital input. For example, MOSFET 38 could be N channel and MOSFET 40 could be P channel and the gate electrode of each could be connected to $a_0$.

The saturation characteristics of MOSFET devices are well known and are explained in the above mentioned text by Grove.

The operation of analog to digital converter 10 is as follows. The external constant current source 15 is adjusted to produce a constant current $I_{SET}$ to MOSFETs 32, 34, etc., resulting in a voltage $V_{REF}$ being applied to the gate and drain of MOSFETs 32, 34, etc. Since MOSFETs 32, 34, etc. have their gates and drains tied together, they are automatically operated in the current saturation region of their current voltage characteristics. A digital N-bit number is applied to inputs $a_0$-..$a_{N-1}$, the analog equivalent which is to be generated in current form at node 46 in the form of current $I_o$. Each of the input buffers in section 12 generates an internal signal such as $A_0$ representative of logic level applied at the input and a complement signal such as $\bar{A}_0$. For example, assume that a logical 0 is applied at $a_0$ and a logical 1 is applied at $a_1$ and logical 0's are applied to the remaining inputs. Then MOSFET 38 will be off and MOSFET 40 will be one, holding node 42 at ground volts, insuring that MOSFET 44 is off. However, MOSFET 48 will be on and MOSFET 50 will be off, so that node 52 will be at $V_{REF}$ volts so that MOSFETs 54 and 56 are in the on condition. All of the other MOSFETs connected to node 46 will be in the off condition. Therefore, the analog current $I_o$ is equal to the sum of the current through MOSFETs 54 and 56. This current represents the binary signal applied to the inputs. If, for example, a 0 is then changed from a logical 0 to a logical 1, MOSFET 44 would be turned on and $I_o$ would equal three unit currents as representing a binary 3 applied to the inputs. Of course, operational amplifier 66 merely converts the current $I_o$ to a proportional output voltage.

It can be seen that MOSFETs 32, 34, etc. in circuit 14 each have the same geometry, i.e., channel length and channel width as the unit current MOSFETs such as 44, 54, 56, etc. each MOSFET in a silicate group in section 22 will have the same current flowing through it as each of MOSFETs 32, 34, etc., since they will all have the same gate voltage $V_{REF}$ applied thereto, and all will be operating in the current saturation portion of their voltage has a current characteristics assuming that $V_0$ is established at a bias voltage of sufficiently large magnitude to insure operation in a current saturation. It is therefore readily seen that circuit 14 acts to establish a ratio between $I_SET$, the current of current source 15, and the analog current $I_o$ for any particular configuration of binary digital inputs to analog to digital converter circuit 10.

What is claimed is:

1. A digital to analog converter comprising:
   N binary inputs for applying N signals representative of an N-bit binary number to said digital to analog converter, N being an integer;
   a first conductor for conducting an analog current representative of an N-bit binary number;

N groups of field effect transistors, each of said field effect transistors having its source electrode connected to a reference voltage conductor and having its drain electrode connected to said first conductor, the gate electrodes of all field effect transistors in each of said groups, respectively, being connected to the gate electrodes of all other field effect transistors in the same group, but not to the gate electrodes of the field effect transistors of any of the other of said groups, each of said groups, respectively, including $2^n$ of said field effect transistors, wherein $n$ has a separate integer value in the range $0 \leq n \leq (N-1)$ for each of said groups, respectively;

input means coupled to said N inputs and to said gate conductors of each of said groups of field effect transistors for switching the field effect transistors in each of said groups, respectively, into an ON condition in response to said N signals;

reference means coupled to said input means for generating a reference voltage which varies in substantially the same manner as the threshold voltages of said field effect transistors;

wherein said input means further includes means for switchably coupling said reference voltage to said gate electrodes of each of said N groups, respectively in response to said N signals in order to switch ON selected ones of said N groups of field effect transistors.

2. The digital to analog converter as recited in claim 1 wherein said reference means includes a second conductor, and at least one field effect transistor having its source coupled to said reference voltage conductor and its gate electrode coupled to said voltage conductor, and a current source coupled to said second conductor.

3. The digital to analog converter as recited in claim 1 wherein said means for switchably coupling said reference voltage includes N field effect transistors coupled, respectively, between said second conductor and said gate electrodes of each of said N groups of field effect transistors, and additionally includes N field effect transistors coupled, respectively, between said reference voltage conductor and said gate electrodes of each of said N groups for electrically coupling said gate electrodes of each of said N groups, respectively, to said second conductor or to said reference voltage conductor in response to said N signals.

4. A digital to analog converter comprising:
N binary inputs for applying N signals representative of an N bit binary number to said digital to analog converter, N being an integer;

a first conductor for conducting an analog current representative of said N bit binary number;

N groups of FET electron control devices, each having a control electrode and two controlled electrodes thereof, each of said electron control devices being connected by means of its controlled electrodes to a reference voltage conductor and to said first conductor, the control electrodes of all electron control devices in each of said groups, respectively, being connected to the control electrodes of the other electron control devices in the same one of said groups, each of said groups, respectively, including $2^n$ of said electron control devices, wherein n has a separate integer value in the range $0 \leq n \leq (N-1)$ for each one of said groups, respectively;

reference means for generating a reference voltage which varies substantially at the same rate as the threshold voltage of said electron control devices; and input means coupled to said N inputs and to said control electrodes of each of said groups of electron control devices and to said reference means for coupling said reference voltage to said control electrodes of each of said groups of electron control devices in response to said N signals.

* * * * *